US008417879B2

(12) United States Patent
Chen et al.

(10) Patent No.: US 8,417,879 B2
(45) Date of Patent: Apr. 9, 2013

(54) METHOD FOR SUPPRESSING ERRORS, AND ASSOCIATED MEMORY DEVICE AND CONTROLLER THEREOF

(75) Inventors: Chun-Yu Chen, Taipei County (TW); Chi-Chih Kuan, Nantou County (TW)

(73) Assignee: Silicon Motion Inc., Taiyuan St., Jhubei, Hsinchu County (TW)

( * ) Notice: Subject to any disclaimer, the term of this patent is extended or adjusted under 35 U.S.C. 154(b) by 353 days.

(21) Appl. No.: 12/907,990

(22) Filed: Oct. 20, 2010

(65) Prior Publication Data
US 2011/0238891 A1 Sep. 29, 2011

(30) Foreign Application Priority Data
Mar. 25, 2010 (TW) .............................. 99108878 A

(51) Int. Cl.
*G06F 12/02* (2006.01)
(52) U.S. Cl. ................. 711/103; 711/E12.008
(58) Field of Classification Search ........................ None
See application file for complete search history.

(56) References Cited

U.S. PATENT DOCUMENTS

| | | | |
|---|---|---|---|
| 8,127,200 B2* | 2/2012 | Sharon et al. | 714/763 |
| 2008/0151618 A1* | 6/2008 | Sharon et al. | 365/185.02 |
| 2008/0215798 A1* | 9/2008 | Sharon et al. | 711/103 |
| 2011/0032759 A1* | 2/2011 | Kim et al. | 365/185.03 |
| 2012/0005409 A1* | 1/2012 | Yang | 711/103 |
| 2012/0166714 A1* | 6/2012 | Mun et al. | 711/103 |
| 2012/0287719 A1* | 11/2012 | Mun et al. | 365/185.18 |

* cited by examiner

*Primary Examiner* — Kevin Verbrugge
(74) *Attorney, Agent, or Firm* — Winston Hsu; Scott Margo

(57) ABSTRACT

A method for suppressing errors is provided. The method is applied to a controller of a Flash memory, where the Flash memory includes a plurality of blocks. The method includes: according to an address of data to be written into or read from the Flash memory, determining whether to utilize an original seed as an input seed of a randomizer/derandomizer, where the randomizer/derandomizer is arranged to generate a random function according to the input seed, with the random function being utilized for adjusting a plurality of bits of the data bit by bit, and with regard to at least each block of the blocks, a value of the original seed remains unvaried; and when it is determined that the original seed should not be utilized as the input seed, generating the random function according to a new seed to adjust the data.

20 Claims, 8 Drawing Sheets $$A = \begin{Bmatrix} 0 & 0 & 1 & 0 & 1 \\ 1 & 0 & 0 & 0 & 0 \\ 0 & 1 & 0 & 0 & 0 \\ 0 & 0 & 1 & 0 & 0 \\ 0 & 0 & 0 & 1 & 0 \end{Bmatrix}$$

FIG. 3A

METHOD FOR SUPPRESSING ERRORS, AND ASSOCIATED MEMORY DEVICE AND CONTROLLER THEREOF

BACKGROUND OF THE INVENTION

1. Field of the Invention

The present invention relates to access to a Flash memory, and more particularly, to a method for suppressing errors, and to an associated memory device and a controller thereof.

2. Description of the Prior Art

As technologies of Flash memories progress in recent years, many kinds of portable memory devices (e.g. memory cards respectively complying with SD/MMC, CF, MS, and XD standards) or solid state drives (SSDs) equipped with Flash memories are widely implemented in various applications. Therefore, the control of access to Flash memories in these memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of at least two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a memory device over the Flash memory therein can comply with related standards, the controller of the Flash memory should have some handling mechanisms in order to properly handle its data access operations.

According to the related art, the memory device having the aforementioned handling mechanisms may still suffer from some deficiencies. For example, due to usage behaviors of the user, data of some specific data patterns would probably be constantly written into the Flash memory, where these specific data patterns may easily cause errors such as write/program errors, read errors, etc. Although the memory device may be equipped with a randomizer for adjusting data in order to solve such a problem, the data after adjustment is typically not random enough due to the conventional low cost design. According to the typical implementation of the related art, with regard to each sector, the value of an input seed of the randomizer remains unvaried (i.e. for each sector, the input seed always has the same value), so the problem mentioned above are not really resolved. Therefore, a novel method is required for performing data pattern management regarding data accessed by the controller in order to reduce the probability of error occurrence.

SUMMARY OF THE INVENTION

It is therefore an objective of the claimed invention to provide a method for suppressing errors, and to provide an associated memory device and a controller thereof, in order to solve the above-mentioned problems.

According to a preferred embodiment of the claimed invention, a method for suppressing errors is provided. The method is applied to a controller of a Flash memory, where the Flash memory comprises a plurality of blocks. The method comprises: according to an address of data to be written into or read from the Flash memory, determining whether to utilize an original seed as an input seed of a randomizer/derandomizer, wherein the randomizer/derandomizer is arranged to generate a random function according to the input seed, with the random function being utilized for adjusting a plurality of bits of the data bit by bit, and with regard to at least each block of the blocks, a value of the original seed remains unvaried; when it is determined that the original seed should be utilized as the input seed, inputting the original seed into the randomizer/derandomizer, in order to generate the random function according to the original seed to adjust the data; and when it is determined that the original seed should not be utilized as the input seed, inputting a new seed into the randomizer/derandomizer, in order to generate the random function according to the new seed to adjust the data.

While the method mentioned above is disclosed, an associated memory device is further provided. The memory device comprises: a Flash memory comprising a plurality of blocks; and a controller arranged to access the Flash memory and manage the plurality of blocks, and further suppress errors regarding data accessed by the controller itself. In addition, the controller comprises a randomizer/derandomizer arranged to generate a random function according to an input seed, with the random function being utilized for adjusting a plurality of bits of the data bit by bit when the controller receives a write/read command, wherein the write/read command is utilized for instructing the controller to write the data into/read the data from the Flash memory, the controller determines whether to utilize an original seed as the input seed according to an address of the data, and with regard to at least each block of the blocks, a value of the original seed remains unvaried. Additionally, when it is determined that the original seed should be utilized as the input seed, the controller inputs the original seed into the randomizer/derandomizer, in order to generate the random function according to the original seed to adjust the data; and when it is determined that the original seed should not be utilized as the input seed, the controller inputs a new seed into the randomizer/derandomizer, in order to generate the random function according to the new seed to adjust the data.

While the method mentioned above is disclosed, a controller of a memory device is further provided, wherein the controller is utilized for accessing a Flash memory comprising a plurality of blocks. The controller comprises: a read only memory (ROM) arranged to store a program code; a microprocessor arranged to execute the program code to control access to the Flash memory and manage the plurality of blocks, and further suppress errors regarding data accessed by the controller itself; and a randomizer/derandomizer arranged to generate a random function according to an input seed, with the random function being utilized for adjusting a plurality of bits of the data bit by bit when the controller receives a write/read command, wherein the write/read command is utilized for instructing the controller to write the data into/read the data from the Flash memory, the controller determines whether to utilize an original seed as the input seed according to an address of the data, and with regard to at least each block of the blocks, a value of the original seed remains unvaried. In addition, when it is determined that the original seed should be utilized as the input seed, the controller inputs the original seed into the randomizer/derandomizer, in order to generate the random function according to the original seed to adjust the data; and when it is determined that the original seed should not be utilized as the input seed, the controller inputs a new seed into the randomizer/derandomizer, in order to generate the random function according to the new seed to adjust the data.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3A-3B respectively illustrate a conversion matrix and a corresponding conversion circuit involved with the method shown in FIG. 2 according to an embodiment of the present invention.

DETAILED DESCRIPTION

Figure 1:
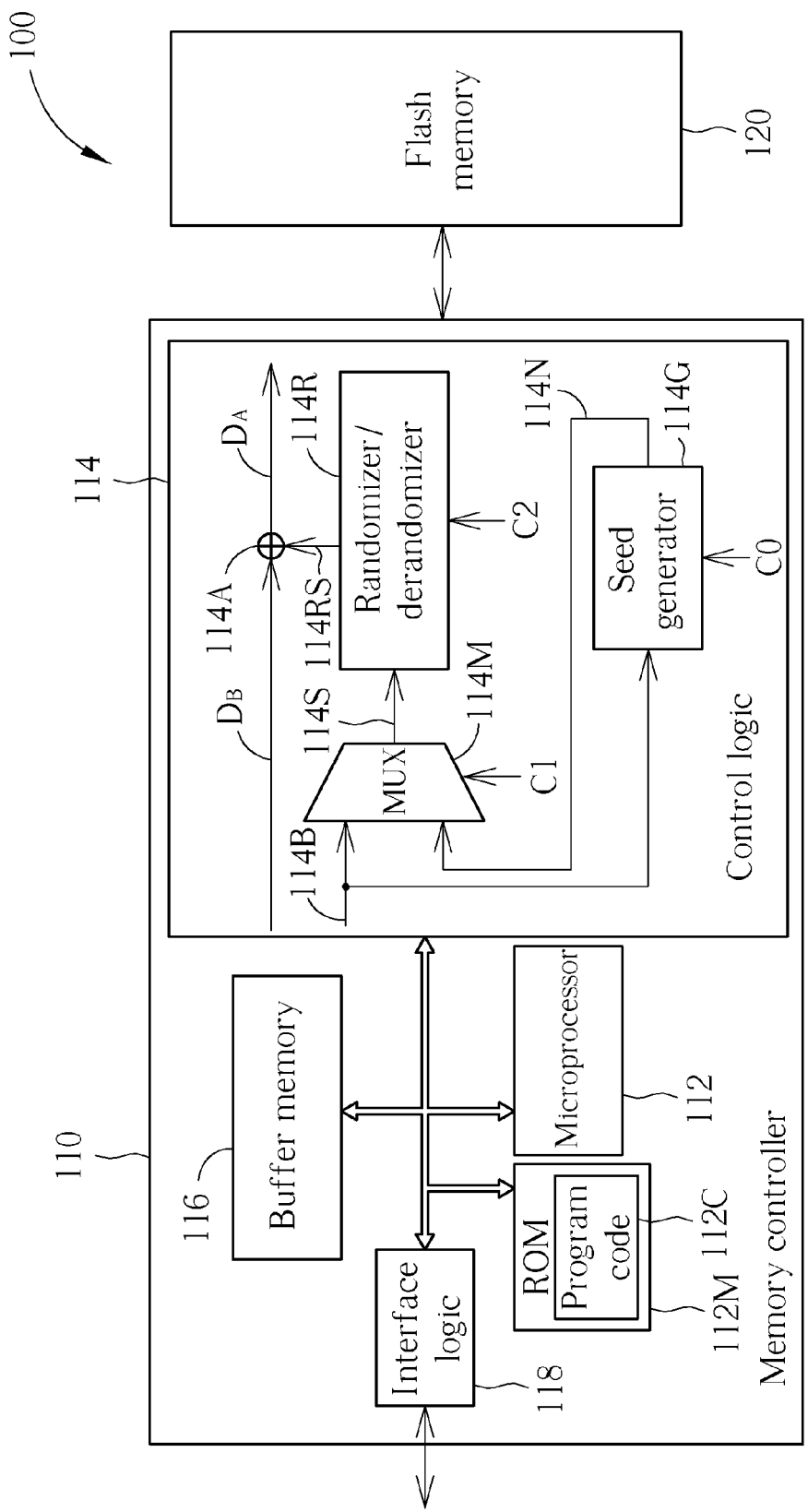
FIG. 1 is a diagram of a memory device according to a first embodiment of the present invention.

Please refer to FIG. 1, which illustrates a diagram of a memory device 100 according to a first embodiment of the present invention. In particular, the memory device 100 of this embodiment is a portable memory device, examples of which may include, but not limited to, memory cards complying with SD/MMC, CF, MS, or XD standards, and Universal Serial Bus (USB) Flash drives (which can be referred to as USB Flash disks). The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. In addition, the control logic 114 comprises an adjustment unit 114A, a seed generator 114G, a multiplexer 114M (labeled "MUX" in FIG. 1), and a randomizer/derandomizer 114R. In practice, the adjustment unit 114A can be an exclusive OR (XOR) gate or an adder. Please note that the portable memory device is taken as an example of the memory device 100 in this embodiment. This is for illustrative purposes only, and is not meant to be a limitation of the present invention. According to a variation of this embodiment, the memory device 100 can be a solid state drive (SSD).

In this embodiment, the ROM 112M is arranged to store a program code 112C, and the microprocessor 112 is arranged to execute the program code 112C to control the access to the Flash memory 120. Typically, the Flash memory 120 comprises a plurality of blocks, and the controller (e.g. the memory controller 110 that executes the program code 112C by utilizing the microprocessor 112) performs data erasure operations on the Flash memory 120 by erasing in units of blocks. In addition, a block can be utilized for recording a specific amount of pages, where the controller mentioned above performs data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device. According to this embodiment, in addition to accessing the Flash memory 120, the memory controller 110 is capable of properly managing the plurality of blocks.

In addition, the memory controller 110 can further suppress errors regarding data accessed by the memory controller 110 itself (e.g. the data $D_B$ shown in FIG. 1), and more particularly, suppress errors by utilizing operations of the randomizer/derandomizer 114R. More specifically, the randomizer/derandomizer 114R is arranged to generate a random function according to an input seed 114S, with the random function being utilized for adjusting a plurality of bits of the data (e.g. the data $D_B$) bit by bit when the controller receives a write/read command, where the write/read command is utilized for instructing the controller to write the data into/read the data from the Flash memory 120. As a result, the adjustment unit 114A shown in FIG. 1 adjusts the data $D_B$ according to the random sequence 114RS (i.e. the sequence of the random function mentioned above) to generate the adjusted data $D_A$. For example, in a situation where the write/read command mentioned above represents a write command, when the data path passing through the adjustment unit 114A represents a write path, the data $D_B$ may represent the data to be written into the Flash memory 120 by the controller, and the data $D_A$ may represent the adjusted data for being written. In anther example, in a situation where the write/read command mentioned above represents a read command, when the data path passing through the adjustment unit 114A represents a read path, the data $D_B$ may represent the data read from the Flash memory 120 by the controller, and the data $D_A$ may represent the adjusted data for being further processed to be sent back to the host device. In practice, the memory controller 110 that executes the program code 112C by utilizing the microprocessor 112 can generate control signals C0, C1, and C2, in order to control the seed generator 114G, the multiplexer 114M, and the randomizer/derandomizer 114R.

In this embodiment, the control signal C0 may carry at least one index for indicating the sector, the word, and/or the byte that the data $D_B$ corresponds to, and more particularly, for indicating the portion currently being processed within the data $D_B$. In addition to the control signal C0, the seed generator 114G of this embodiment further receives the original seed 114B. As a result, according to the control of the control signal C0, the seed generator 114G can adjust the original seed 114B correspondingly to generate the new seed 114N, where the new seed 114N corresponds to the index, and the new seed 114N is typically different from the original seed 114B since the seed generator 114G (whose implementation details will be described later) is properly designed. Thus, even in a situation where the original seed 114B is generated by utilizing the architecture of the conventional low cost design, causing repeated occurrence of the same value of the original seed 114B, there is no repeated occurrence of the same value of the new seed 114N. In addition, the control of the control signal C1 is utilized for controlling multiplexing operations of the multiplexer 114M, in order to make the multiplexer 114M correspondingly multiplex the original seed 114B or the new seed 114N as the input seed 114S of the randomizer/derandomizer 114R. Additionally, the control of the control signal C2 is utilized for controlling loading operations of the randomizer/derandomizer 114R, in order to make the randomizer/derandomizer 114R be able to correctly load the input seed 114S.

Based upon the architecture shown in FIG. 1, as there is no repeated occurrence of the same value of the new seed 114N, as long as the operations of selecting the original seed 114B or the new seed 114N as the input seed 114S can be properly controlled, the related art problem that the adjusted data is not random enough is no longer an issue. As a result, the original seed 114B can still be generated by utilizing the architecture of the conventional low cost design. In this embodiment, with regard to at least each block of the blocks, the value of the original seed 114B remains unvaried, where for each block of the blocks, the same original seed 114B is utilized. For example, with regard to each page of each block, the value of the original seed 114B remains unvaried. More particularly, with regard to each sector of each block, the value of the original seed 114B remains unvaried. Please refer to FIG. 2 for related details of error suppression performed by the memory controller 110.

Figure 2:
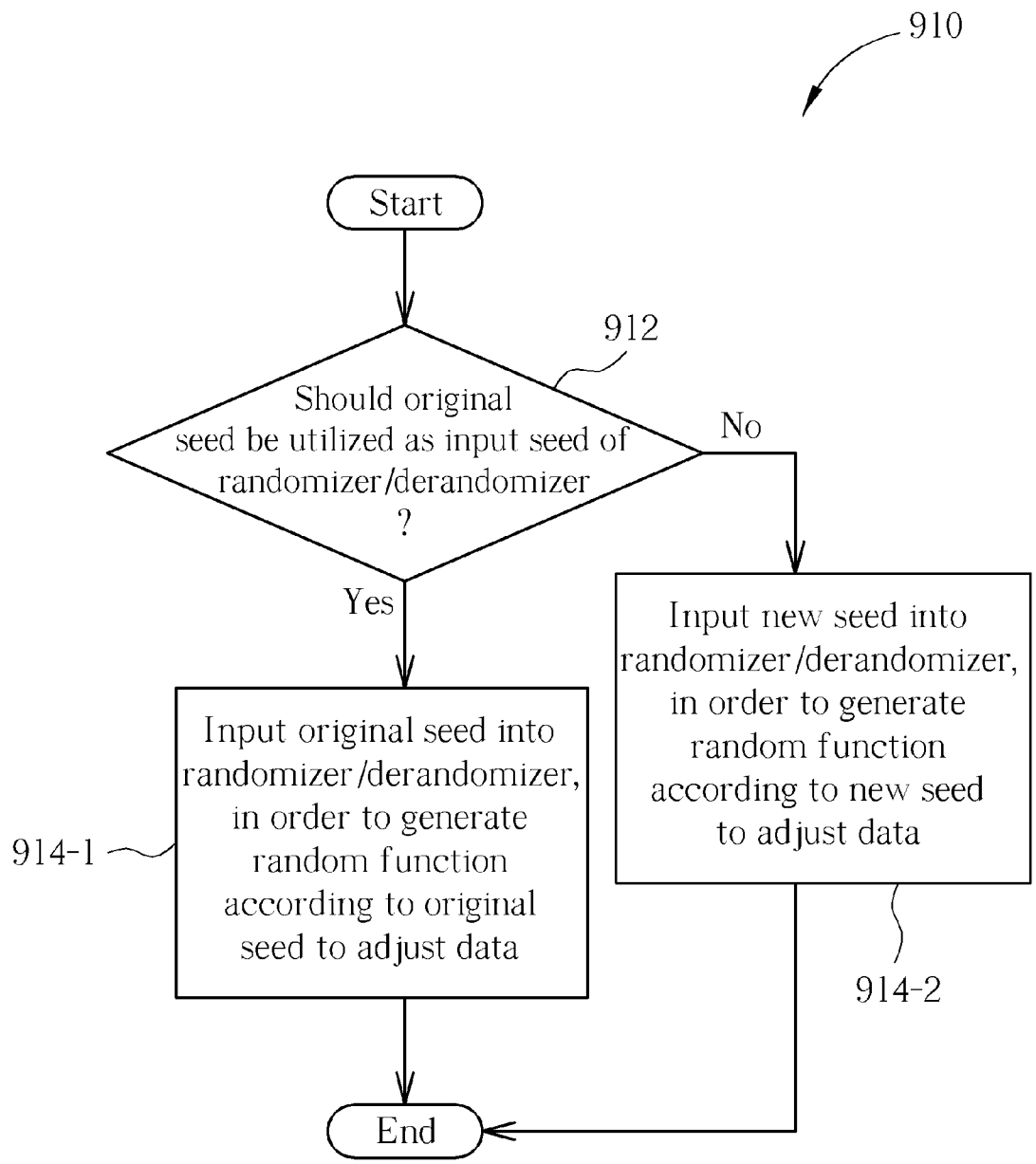
FIG. 2 is a flowchart of a method for suppressing errors according to one embodiment of the present invention.

FIG. 2 is a flowchart of a method 910 for suppressing errors according to one embodiment of the present invention. The method can be applied to the memory device 100 shown in FIG. 1, and more particularly, to the controller mentioned above (e.g. the memory controller 110 that executes the program code 112C by utilizing the microprocessor 112). In addition, the method can be implemented by utilizing the memory device 100 shown in FIG. 1, and more particularly, by utilizing the controller mentioned above. The method 910 is described as follows.

In Step 912, the controller determines whether to utilize the original seed 114B as the input seed 114S of the randomizer/derandomizer 114R according to an address of the data to be written into or read from the Flash memory 120 (e.g. the data $D_B$). When it is determined that the original seed 114B should be utilized as the input seed 114S, Step 914-1 is entered; otherwise (i.e. when it is determined that the original seed 114B should not be utilized as the input seed 114S), Step 914-2 is entered.

In Step 914-1, the controller inputs the original seed 114B into the randomizer/derandomizer 114R, in order to generate the random function according to the original seed 114B to adjust the data.

In Step 914-2, the controller inputs the new seed 114N into the randomizer/derandomizer 114R, in order to generate the random function according to the new seed 114N to adjust the data.

In this embodiment, when the address mentioned in Step 912 falls within a predetermined range, the controller determines that the original seed 114B should be utilized as the input seed 114S. In addition, when the address does not fall within the predetermined range, the controller determines that the original seed 114B should not be utilized as the input seed 114S. For example, with regard to each block, the value of the original seed 114B remains unvaried, and in this situation, the predetermined range may correspond to a block, a page, a sector, or a storage unit that is smaller than the sector. In another example, with regard to each page of each block, the value of the original seed 114B remains unvaried, and in this situation, the predetermined range may correspond to a page, a sector, or a storage unit that is smaller than the sector, where the page mentioned in this situation may comprise multiple sectors. In another example, with regard to each sector of each block, the value of the original seed 114B remains unvaried, and in this situation, the predetermined range may correspond to a sector or a storage unit that is smaller than the sector.

According to this embodiment, the seed generator 114G is arranged to adjust the original seed 114B to generate the new seed 114N, where the original seed 114B comprises a plurality of bits, and the new seed 114N comprises a plurality of bits. In addition, the seed generator 114G stores one or more predetermined matrixes, and more particularly, a plurality of predetermined matrixes $A^{Z(1)}, A^{Z(2)}, \ldots,$ and $A^{Z(X)}$, where the notation A represents a conversion matrix of the randomizer/derandomizer 114R regarding the random sequence 114RS, and in this embodiment, the seed generator 114G can be regarded as a circuit for implementing the aforementioned one or more predetermined matrixes. As a result, the seed generator 114G utilizes the original seed 114B and a specific predetermined matrix of the one or more predetermined matrixes to perform operations, in order to generate the new seed 114N. For example, in a situation where the original seed 114B and the new seed 114N respectively comprise W bits, the conversion matrix A is a W by W matrix, and the predetermined matrixes $A^{Z(1)}, A^{Z(2)}, \ldots,$ and $A^{Z(X)}$ mentioned above are also W by W matrixes, respectively. Please note that the conversion matrix A is not limited to be a square matrix. In another example, the conversion matrix A can be a W by M matrix or an M by W matrix as long as the conversion matrix A can be utilized for performing multiplication operations on the original seed 114B, where M is not equal to W.

Here, the random sequence 114RS can be expressed as the sequence {RS(t)|t is an integer} (with t being an index corresponding to time), and the relationship between any value RS(t) of this sequence and the next value RS(t+1) thereof can be expressed according to the following equation:

$$RS(t+1)=A*RS(t);$$

Thus, when the value of the input seed 114S is equal to $RS(t_0)$, by utilizing the conversion expressed by the above equation, the randomizer/derandomizer 114R can generate at least one portion (e.g. a portion or all) of the sequence {RS (t)}, and more particularly, the portion starting from $RS(t_0+1)$, i.e. the sequence $\{RS(t)|t \geq (t_0+1)\}$.

Figure 3B:
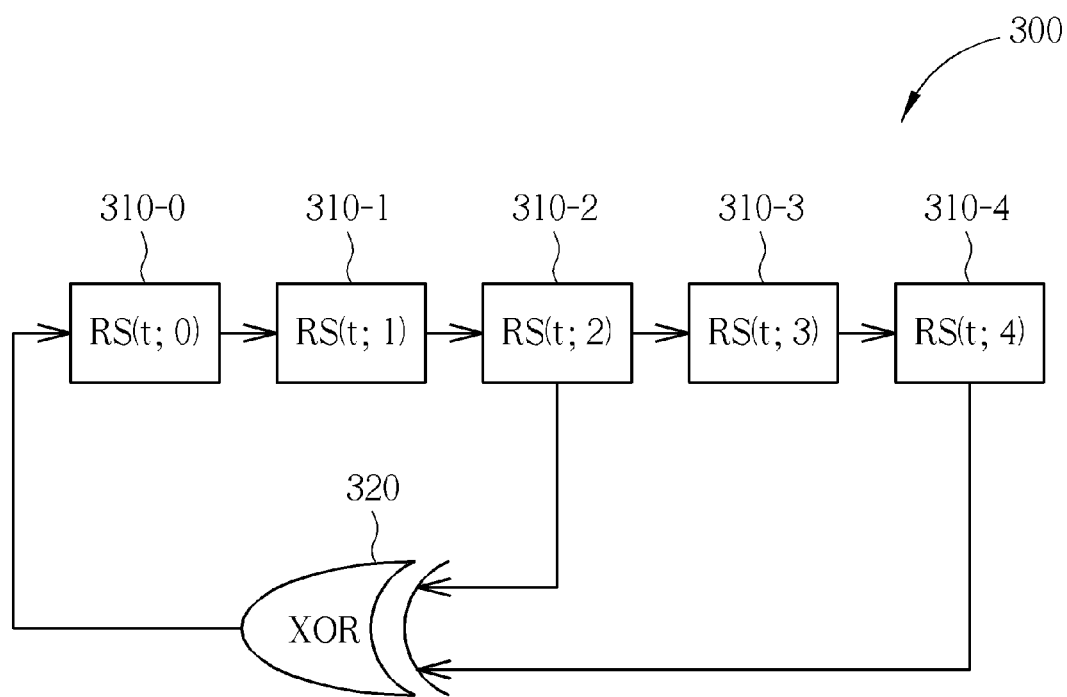

FIGS. 3A-3B respectively illustrate the conversion matrix A and the corresponding conversion circuit 300 involved with the method 910 shown in FIG. 2 according to an embodiment of the present invention, where the conversion circuit 300 is positioned within the randomizer/derandomizer 114R, and the conversion circuit 300 comprises W registers 310-0, 310-1, ..., and 310-(W−1) and an XOR gate 320 (labeled "XOR" in FIG. 3B). In a situation where W=5, the registers 310-0, 310-1, 310-2, 310-3, and 310-4 (respectively labeled "RS(t; 0)", "RS(t; 1)", "RS(t; 2)", "RS(t; 3)", and "RS(t; 4)" in FIG. 3B) store respective bits RS(t; 0), RS(t; 1), RS(t; 2), RS(t; 3), and RS(t; 4) of the binary form of the value RS(t), respectively. According to the architecture shown in FIG. 3B, the randomizer/derandomizer 114R can generate at least one portion of the sequence {RS(t)}, such as a portion or all of the sequence {RS(t)}.

Figure 4A:
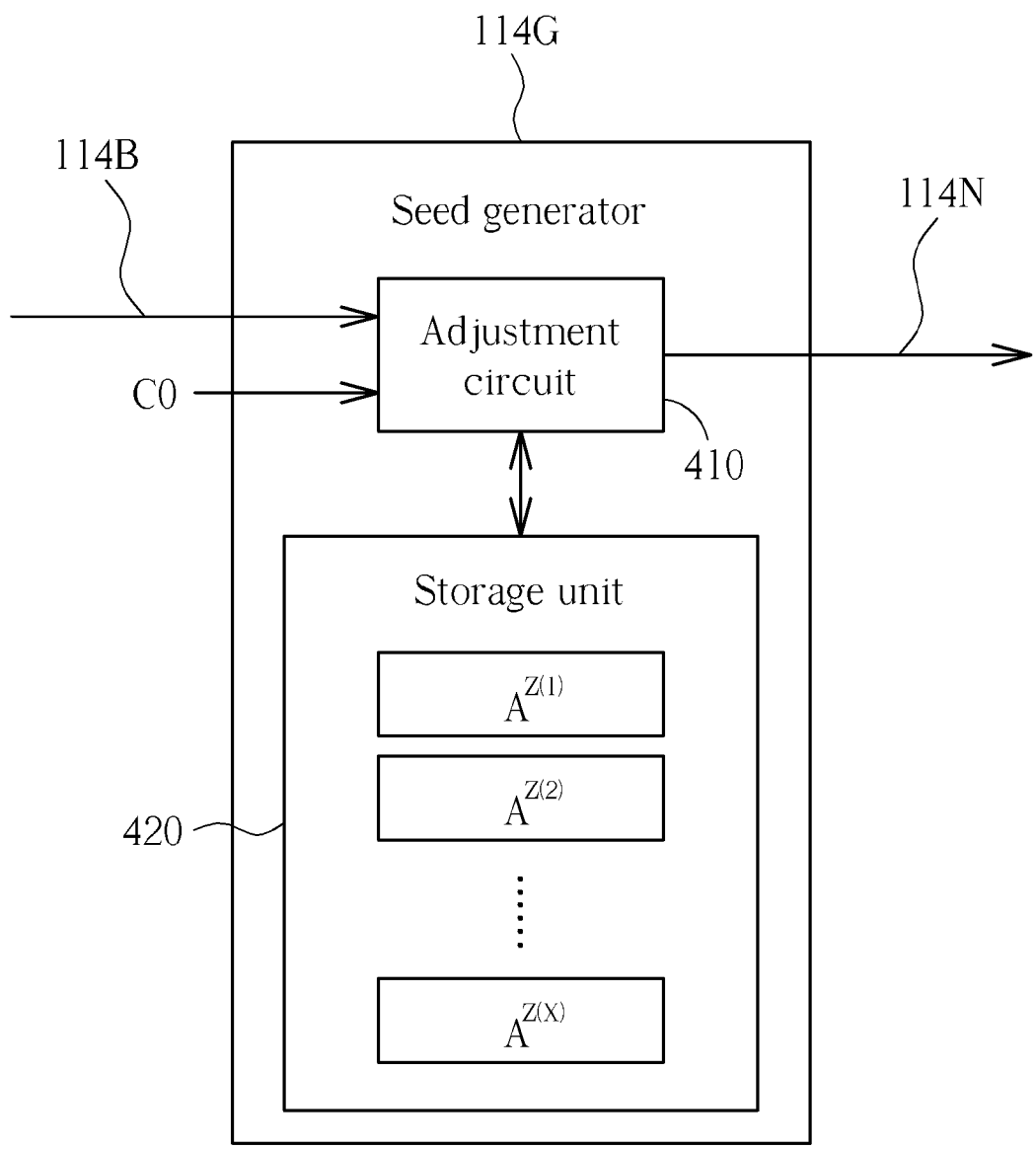
FIG. 4A illustrates some implementation details of the seed generator shown in FIG. 1 that are involved with the method shown in FIG. 2 according to an embodiment of the present invention.

FIG. 4A illustrates some implementation details of the seed generator shown in FIG. 1 that are involved with the method 910 shown in FIG. 2 according to an embodiment of the present invention. According to this embodiment, the seed generator 114G comprises an adjustment circuit 410 and a storage unit. The storage unit 420 stores X predetermined matrixes $A^{Z(1)}, A^{Z(2)}, \ldots,$ and $A^{Z(X)}$, where $Z(1), Z(2), \ldots,$ and $Z(X)$ are all positive integers, and more particularly, positive integers that are different from each other. In addition, according to the aforementioned at least one index, the seed generator 114G (and more particularly, the adjustment circuit 410) selects a corresponding predetermined matrix $A^{Z(x)}$ from the X predetermined matrixes $A^{Z(1)}, A^{Z(2)}, \ldots,$ and $A^{Z(X)}$, where x=1, 2, ..., or X, and the control signal C0 carries the aforementioned at least one index. As a result, the seed generator 114G utilizes the predetermined matrix $A^{Z(x)}$ to adjust the original seed 114B, in order to generate the new seed 114N. According to a special case of this embodiment, $Z(1), Z(2), \ldots,$ and $Z(X)$ can be an arithmetic sequence. According to another special case of this embodiment, $Z(1), Z(2), \ldots,$ and $Z(X)$ can be an arithmetic sequence, and the common difference of successive members of this arithmetic sequence $Z(1), Z(2), \ldots,$ and $Z(X)$ is equal to $Z(1)$.

Figure 4B:
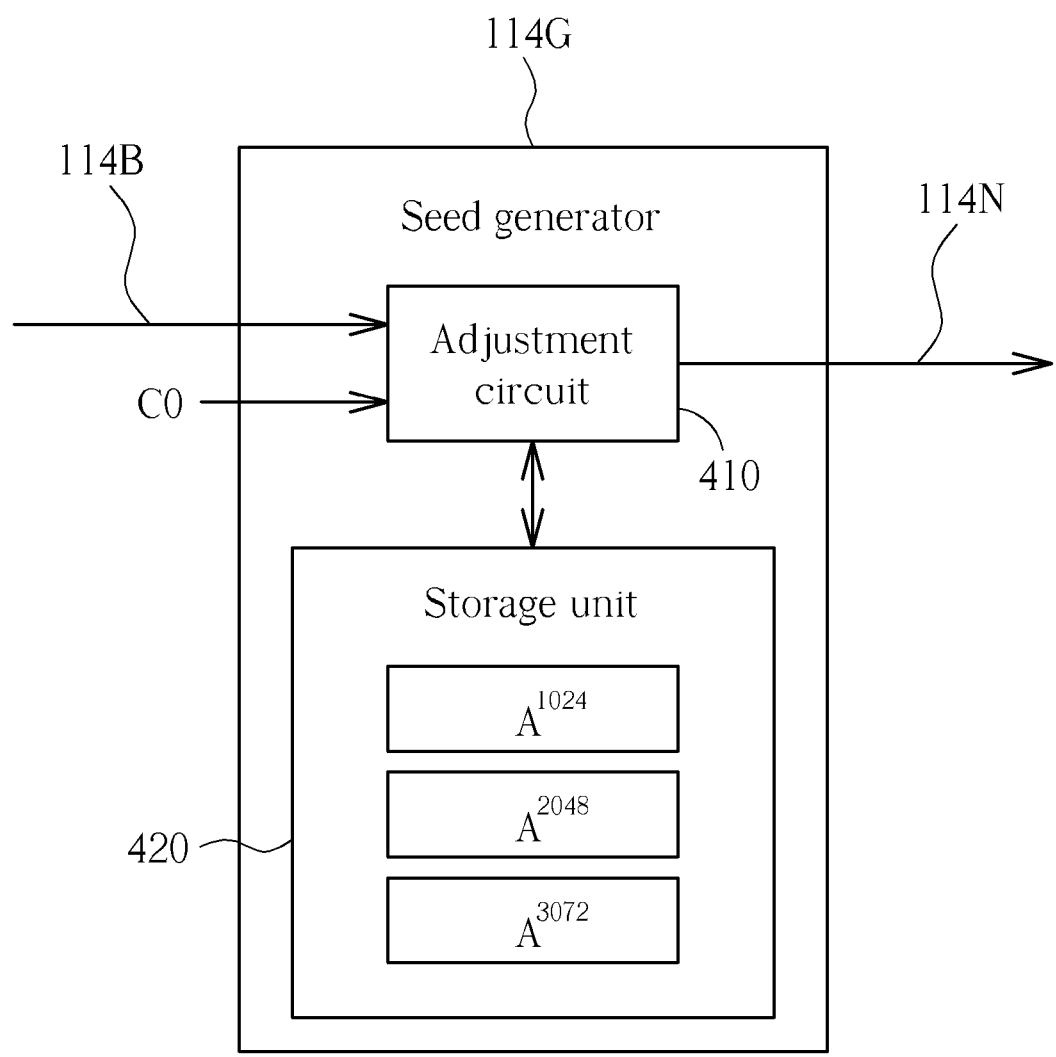
FIG. 4B illustrates some implementation details of the seed generator shown in FIG. 1 that are involved with the method shown in FIG. 2 according to another embodiment of the present invention.
Figure 5:
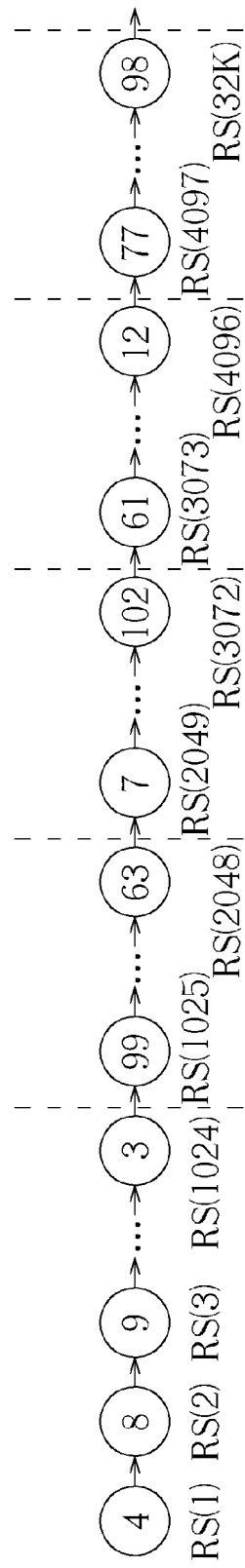
FIG. 5 illustrates a series of values involved with the embodiment shown in FIG. 4B, while the series of values can be generated in a situation where the number of cycles of operations of the randomizer/derandomizer shown in FIG. 1 is not limited.

FIG. 4B illustrates some implementation details of the seed generator 114G shown in FIG. 1 that are involved with the method 910 shown in FIG. 2 according to another embodiment of the present invention, where this embodiment is a special case of the embodiment shown in FIG. 4A. In this embodiment, $Z(x)=(1024*x)$ and X=3, and each page comprises 4 kilobytes and each sector comprises 1 kilobyte (i.e. each page comprises 4 sectors), given that 1 kilobyte is 1024 bytes. As shown in FIG. 4B, the storage unit 420 stores 3 predetermined matrixes $A^{1024}, A^{2048},$ and $A^{3072}$. Please refer to FIG. 5 for better comprehension. FIG. 5 illustrates a series of values involved with the embodiment shown in FIG. 4B, while the series of values can be generated in a situation where the number of cycles of operations of the randomizer/derandomizer 114R shown in FIG. 1 is not limited. As shown in FIG. 5, the series of values comprise {RS(1), RS(2), RS(3), ..., RS(1024)}, {RS(1025), ..., RS(2048)}, {RS(2049), ..., RS(3072)}, {RS(3073), ..., RS(4096)}, and {RS(4097), ..., RS(32K)}, where RS(32K) represents RS(32768). In a situation where W=8, each value of the series of values falls within the range of the interval [0, 255]. Here, the numbers in the respective circles shown in FIG. 5 are taken as examples of the series of values. This is for illustrative purposes only, and is not meant to be a limitation of the present invention. According to a variation of this embodiment, these numbers in the respective circles shown in FIG. 5 can be varied.

According to this embodiment, after the value RS(32K) is generated, the next value to be generated (i.e. the value to be subsequently generated after generating the value RS(32K)) is the first value RS(1) of this series of values, where this series of values can be generated repeatedly. In general, this series of values can be divided into (Y+1) portions as follows:
{RS(Z(0)+1), RS(Z(0)+2), ..., RS(Z(1))};
{RS(Z(1)+1), RS(Z(1)+2), ..., RS(Z(2))};
{RS(Z(2)+1), RS(Z(2)+2), ..., RS(Z(3))};
... and
{RS(Z(Y)+1), RS(Z(Y)+2), ..., RS(Z(Y+1))};
where Y=31 in this embodiment.

Suppose that after the controller inputs the original seed 114B into the randomizer/derandomizer 114R and a cycle goes by, the first value that appears within the random sequence 114RS is RS(1), and the predetermined range utilized by the controller corresponds to a sector (which comprises 1 kilobyte), and more particularly, the first sector of any page. As a result, when the address mentioned in Step 912 falls within the predetermined range, which means the address represents the first sector of a certain page, the controller determines that the original seed 114B should be utilized as the input seed 114S. In addition, when the address does not fall within the predetermined range, and more particularly, when the address represents the $(v+1)^{th}$ sector of a certain page, under control of the controller, the seed generator 114G can utilize the original seed 114B and the predetermined matrix $A^{Z(v)}$ to perform operations, in order to generate the new seed 114N, where v=1, 2, or 3. Similar descriptions for this embodiment are not repeated in detail here.

According to a variation of this embodiment, the predetermined range utilized by the controller corresponds to a sector (which comprises 1 kilobyte), and more particularly, the first sector of each set of sectors. In this embodiment, each set of sectors may comprise 32 sectors. In addition, the storage unit 420 stores 31 predetermined matrixes $A^{1024}, A^{2048}, A^{3072}, \ldots$ and $A^{31K}$, where $A^{31K}$ represents $A^{31744}$. As a result, when the address mentioned in Step 912 falls within the predetermined range, which means the address represents the first sector of a certain set of sectors, the controller determines that the original seed 114B should be utilized as the input seed 114S. Additionally, when the address does not fall within the predetermined range, and more particularly, when the address represents the $(v+1)^{th}$ sector of a certain set of sectors, under control of the controller, the seed generator 114G can utilize the original seed 114B and the predetermined matrix $A^{Z(v)}$ to perform operations, in order to generate the new seed 114N, where v=1, 2, ..., or 31. Similar descriptions for this variation are not repeated in detail here.

Figure 6:
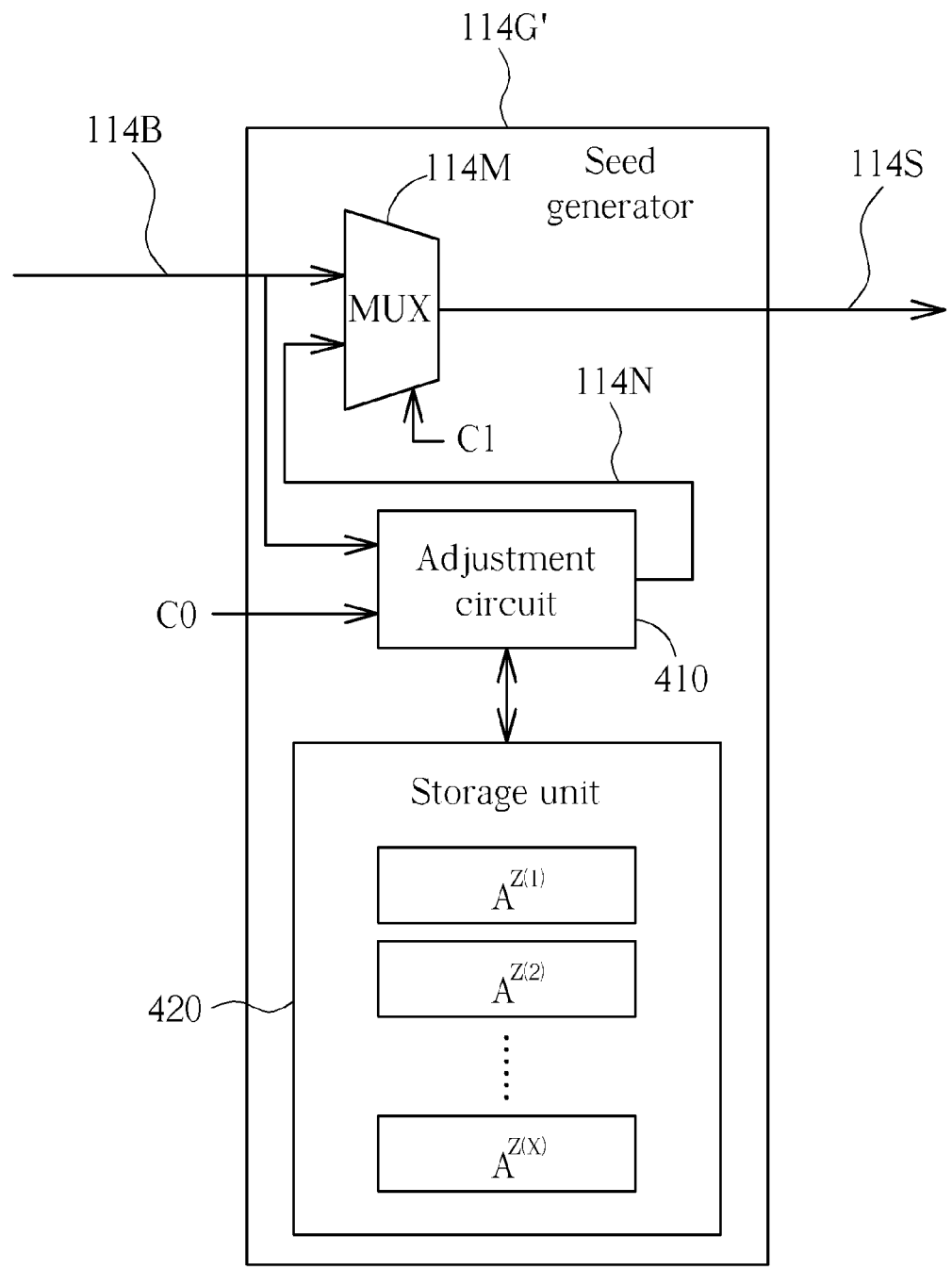
FIG. 6 is a diagram of a seed generator of a memory device according to a second embodiment of the present invention.

FIG. 6 is a diagram of a seed generator 114G' of a memory device 200 according to a second embodiment of the present invention, where this embodiment is a variation of the first embodiment. The multiplexer 114M of this embodiment is integrated into the seed generator 114G mentioned above, and in response to the change of the architecture, the seed generator of this embodiment is labeled using a similar notation such as 114G', where the seed generator 114G' inputs the aforementioned input seed 114S into the randomizer/derandomizer 114R mentioned above. Thus, the memory device 200 of this embodiment (or the memory controller 210 thereof) can be distinguished from the memory device 100 shown in FIG. 1 (or the memory controller 110 thereof) according to whether the multiplexer 114M is positioned within the seed generator. Similar descriptions for this embodiment are not repeated in detail here.

It is an advantage of the present invention that, by properly designing the seed generator 114G accompanied with associated control (e.g. the control signals C0, C1, and C2), the present invention can properly perform data pattern management regarding data accessed by the controller, in order to reduce the probability of error occurrence. In addition, implementing according to any of the respective embodiments/variations disclosed above will not cause unreasonable additional costs, while the original seed 114B can still be generated by utilizing the architecture of the conventional low cost design. Therefore, by implementing based upon one or more of the embodiments/variations disclosed above, the related art problems can be resolved without greatly increasing the overall costs.

Those skilled in the art will readily observe that numerous modifications and alterations of the device and method may be made while retaining the teachings of the invention.

What is claimed is:

1. A method for suppressing errors, the method being applied to a controller of a Flash memory, the Flash memory comprising a plurality of blocks, the method comprising:
   according to an address of data to be written into or read from the Flash memory, determining whether to utilize an original seed as an input seed of a randomizer/derandomizer, wherein the randomizer/derandomizer is arranged to generate a random function according to the input seed, with the random function being utilized for adjusting a plurality of bits of the data bit by bit, and with regard to at least each block of the blocks, a value of the original seed remains unvaried;
   when it is determined that the original seed should be utilized as the input seed, inputting the original seed into the randomizer/derandomizer, in order to generate the random function according to the original seed to adjust the data; and
   when it is determined that the original seed should not be utilized as the input seed, inputting a new seed into the randomizer/derandomizer, in order to generate the random function according to the new seed to adjust the data.

2. The method of claim 1, further comprising:
   providing a seed generator, wherein the seed generator is arranged to adjust the original seed to generate the new seed.

3. The method of claim 2, wherein the original seed comprises a plurality of bits, and the new seed comprises a plurality of bits; the seed generator stores one or more predetermined matrixes; and the method further comprises:
   utilizing the original seed and a specific predetermined matrix of the one or more predetermined matrixes to perform operations, in order to generate the new seed.

4. The method of claim 3, further comprising:
   selecting the specific predetermined matrix from the one or more predetermined matrixes according to at least one index, wherein the at least one index is utilized for indicating a sector, a word, and/or a byte that the data corresponds to.

5. The method of claim 1, wherein the step of determining whether to utilize the original seed as the input seed of the randomizer/derandomizer further comprises at least one of the steps of:
   when the address falls within a predetermined range, determining that the original seed should be utilized as the input seed; and
   when the address does not fall within the predetermined range, determining that the original seed should not be utilized as the input seed.

6. The method of claim 5, wherein the predetermined range corresponds to a block, a page, a sector, or a storage unit that is smaller than the sector.

7. The method of claim 1, wherein with regard to each page or each sector of each block, the value of the original seed remains unvaried.

8. A memory device, comprising:
   a Flash memory comprising a plurality of blocks; and
   a controller arranged to access the Flash memory and manage the plurality of blocks, and further suppress errors regarding data accessed by the controller itself, wherein the controller comprises:
      a randomizer/derandomizer arranged to generate a random function according to an input seed, with the random function being utilized for adjusting a plurality of bits of the data bit by bit when the controller receives a write/read command, wherein the write/read command is utilized for instructing the controller to write the data into/read the data from the Flash memory, the controller determines whether to utilize an original seed as the input seed according to an address of the data, and with regard to at least each block of the blocks, a value of the original seed remains unvaried;
   wherein when it is determined that the original seed should be utilized as the input seed, the controller inputs the original seed into the randomizer/derandomizer, in order to generate the random function according to the original seed to adjust the data; and when it is determined that the original seed should not be utilized as the input seed, the controller inputs a new seed into the randomizer/derandomizer, in order to generate the random function according to the new seed to adjust the data.

9. The memory device of claim 8, wherein the controller further comprises:
   a seed generator arranged to adjust the original seed to generate the new seed.

10. The memory device of claim 9, wherein the original seed comprises a plurality of bits, and the new seed comprises a plurality of bits; the seed generator stores one or more predetermined matrixes; and the seed generator utilizes the original seed and a specific predetermined matrix of the one or more predetermined matrixes to perform operations, in order to generate the new seed.

11. The memory device of claim 10, wherein the seed generator selects the specific predetermined matrix from the one or more predetermined matrixes according to at least one index; and the at least one index is utilized for indicating a sector, a word, and/or a byte that the data corresponds to.

12. The memory device of claim 8, wherein when determining whether to utilize the original seed as the input seed of the randomizer/derandomizer, the controller determines based upon at least one of the steps of:
   when the address falls within a predetermined range, determining that the original seed should be utilized as the input seed; and
   when the address does not fall within the predetermined range, determining that the original seed should not be utilized as the input seed.

13. The memory device of claim 12, wherein the predetermined range corresponds to a block, a page, a sector, or a storage unit that is smaller than the sector.

14. The memory device of claim 8, wherein with regard to each page or each sector of each block, the value of the original seed remains unvaried.

15. A controller of a memory device, the controller being utilized for accessing a Flash memory comprising a plurality of blocks, the controller comprising:
   a read only memory (ROM) arranged to store a program code;
   a microprocessor arranged to execute the program code to control access to the Flash memory and manage the plurality of blocks, and further suppress errors regarding data accessed by the controller itself; and
   a randomizer/derandomizer arranged to generate a random function according to an input seed, with the random function being utilized for adjusting a plurality of bits of the data bit by bit when the controller receives a write/read command, wherein the write/read command is utilized for instructing the controller to write the data into/read the data from the Flash memory, the controller determines whether to utilize an original seed as the input seed according to an address of the data, and with regard to at least each block of the blocks, a value of the original seed remains unvaried;

wherein when it is determined that the original seed should be utilized as the input seed, the controller inputs the original seed into the randomizer/derandomizer, in order to generate the random function according to the original seed to adjust the data; and when it is determined that the original seed should not be utilized as the input seed, the controller inputs a new seed into the randomizer/derandomizer, in order to generate the random function according to the new seed to adjust the data.

16. The controller of claim 15, further comprising:

a seed generator arranged to adjust the original seed to generate the new seed.

17. The controller of claim 16, wherein the original seed comprises a plurality of bits, and the new seed comprises a plurality of bits; the seed generator stores one or more predetermined matrixes; and the seed generator utilizes the original seed and a specific predetermined matrix of the one or more predetermined matrixes to perform operations, in order to generate the new seed.

18. The controller of claim 17, wherein the seed generator selects the specific predetermined matrix from the one or more predetermined matrixes according to at least one index; and the at least one index is utilized for indicating a sector, a word, and/or a byte that the data corresponds to.

19. The controller of claim 15, wherein when determining whether to utilize the original seed as the input seed of the randomizer/derandomizer, the controller determines based upon at least one of the steps of:

when the address falls within a predetermined range, determining that the original seed should be utilized as the input seed; and when the address does not fall within the predetermined range, determining that the original seed should not be utilized as the input seed.

20. The controller of claim 19, wherein the predetermined range corresponds to a block, a page, a sector, or a storage unit that is smaller than the sector.

* * * * *